(12) United States Patent
Yosui

(10) Patent No.: US 11,245,171 B2
(45) Date of Patent: *Feb. 8, 2022

(54) TRANSMISSION LINE DEVICE COMPRISING A PLURALITY OF SUBSTRATES EACH HAVING SIGNAL AND GROUND CONDUCTOR PATTERNS THEREON THAT ARE JOINED TO EACH OTHER

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/877,525

(22) Filed: May 19, 2020

(65) Prior Publication Data
US 2020/0280117 A1 Sep. 3, 2020

Related U.S. Application Data

(63) Continuation of application No. PCT/JP2018/046404, filed on Dec. 17, 2018.

(30) Foreign Application Priority Data
Dec. 28, 2017 (JP) .............................. JP2017-254834

(51) Int. Cl.
*H01P 5/02* (2006.01)
*H01P 3/08* (2006.01)
*H01P 1/04* (2006.01)

(52) U.S. Cl.
CPC .............. *H01P 5/028* (2013.01); *H01P 1/047* (2013.01); *H01P 3/082* (2013.01); *H01P 3/088* (2013.01)

(58) Field of Classification Search
CPC .......... H01P 1/047; H01P 3/088; H01P 3/082; H01P 5/028
(Continued)

(56) References Cited

U.S. PATENT DOCUMENTS 7,405,477 B1 7/2008 Tao et al.
2014/0085856 A1 3/2014 Shirao et al.
(Continued)

FOREIGN PATENT DOCUMENTS

JP 08-236894 A 9/1996
JP 2014-082455 A 5/2014
(Continued)

OTHER PUBLICATIONS

Official Communication issued in International Patent Application No. PCT/JP2018/046404, dated Mar. 12, 2019.

*Primary Examiner* — Benny T Lee

(57) ABSTRACT

A transmission line device includes a first multilayer substrate with a transmission line including laminated insulating base materials and a conductor pattern on the insulating base materials, and a second multilayer substrate defining a connected member to which the transmission line of the first multilayer substrate is connected. The conductor pattern includes a signal conductor pattern and a signal electrode pad electrically connected to the signal conductor pattern. The first multilayer substrate includes a resist film provided on a surface of a laminate of the insulating base materials, and the resist film includes an opening that is separated from an outer edge of the signal electrode pad in a surface direction of the laminate of the insulating base material and exposes the signal electrode pad.

18 Claims, 12 Drawing Sheets

(58) Field of Classification Search
USPC .......................................................... 333/246
See application file for complete search history.

(56) References Cited

U.S. PATENT DOCUMENTS

| | | | |
|---|---|---|---|
| 2015/0054600 A1* | 2/2015 | Sasaki et al. | ........... H01P 3/085 |
| | | | 333/238 |
| 2015/0054601 A1 | 2/2015 | Ikemoto et al. | |
| 2017/0033426 A1 | 2/2017 | Baba et al. | |
| 2020/0194859 A1* | 6/2020 | Araki | ...................... H05K 3/363 |

FOREIGN PATENT DOCUMENTS

| | | |
|---|---|---|
| WO | 2014/069061 A1 | 5/2014 |
| WO | 2016/088592 A1 | 6/2016 |

* cited by examiner

COMPARATIVE EXAMPLE

TRANSMISSION LINE DEVICE COMPRISING A PLURALITY OF SUBSTRATES EACH HAVING SIGNAL AND GROUND CONDUCTOR PATTERNS THEREON THAT ARE JOINED TO EACH OTHER

CROSS REFERENCE TO RELATED APPLICATIONS

This application claims the benefit of priority to Japanese Patent Application No. 2017-254834 filed on Dec. 28, 2017 and is a Continuation Application of PCT Application No. PCT/JP2018/046404 filed on Dec. 17, 2018. The entire contents of each application are hereby incorporated herein by reference.

BACKGROUND OF THE INVENTION

1. Field of the Invention

The present invention relates to a substrate joined body including a transmission line including an insulating base material and a conductor pattern, and a transmission line device including such a substrate joined body.

2. Description of the Related Art

WO 2014/069061 A discloses that a transmission line having a complicated shape is provided by joining pieces of multilayer substrate structures having transmission lines.

As in the transmission line described in WO 2014/069061 A, in a structure in which multilayer substrates having transmission lines are joined together, because a plurality of electrode pads provided on one multilayer substrate and a plurality of electrode pads provided on the other multilayer substrate face each other in the same plane, each of the electrode pads is drawn out to a joining surface via an interlayer connection conductor. Then, at the joining surface, the signal electrode pads are connected to each other, and the ground electrode pads are connected to each other.

In the above connection structure, each electrode pad needs to have a large enough area in order to provide joining strength between the electrode pads. However, as the area of the electrode pad provided on the joining surface becomes larger, an unnecessary capacitance is provided between a signal conductor pattern provided on an inner layer of the multilayer substrate, and the electrode pad.

When the capacitance generated between a ground conductor pattern of the inner layer of the multilayer substrate and the signal electrode pad increases near the joining surface, a characteristic impedance of the transmission line becomes discontinuous near the joining surface, causing signal reflection and adversely affecting high-frequency characteristics as the transmission line.

SUMMARY OF THE INVENTION

Preferred embodiments of the present invention provide substrate joined bodies that are each able to reduce or prevent impedance mismatch while ensuring the joining strength of an electrode pad at a portion where a multilayer substrate including a transmission line is connected to another member, and transmission line devices each including such a substrate joined body.

A substrate joined body according to a preferred embodiment of the present invention includes a plurality of substrates each including an insulating base material and a conductor pattern provided on the insulating base material, portions of two adjacent substrates of the plurality of substrates being connected to each other.

The conductor pattern includes a signal conductor pattern, a signal electrode pad electrically connected to the signal conductor pattern, a ground conductor pattern, and ground electrode pads electrically connected to the ground conductor pattern or being a portion of the ground conductor pattern.

A resist film is provided on a surface of the insulating base material, and the resist film includes a first opening that is spaced away from an outer edge of the signal electrode pad in a surface direction of the insulating base material and exposes the signal electrode pad, and second openings that define outer edges of the ground electrode pads and expose the ground conductor pattern.

Further, the substrate has an elongated shape having a length direction and a width direction, the signal electrode pad is provided at a position sandwiched between the ground electrode pads in the length direction, and the signal electrode pad of one of the two adjacent substrates is joined to the signal electrode pad of another of the two adjacent substrates, and the ground electrode pads of one of the two adjacent substrates are joined to the ground electrode pads of another of the two adjacent substrates.

According to the above configuration, the signal electrode pad is entirely or substantially entirely joined to the electrode pad of a connection destination, and there is no portion (i.e., area) that does not contribute to the joining. Therefore, a capacitance generated between the signal electrode pad and the ground conductor pattern of the inner layer of the substrate is reduced or minimized. In other words, when the signal electrode pad includes, below the resist film, an extended portion that is larger than the opening of the resist film, a stray capacitance is generated between the extended portion and the ground conductor pattern. However, according to the above configuration, because the stray capacitance is not generated, the capacitance generated between the signal electrode pad and the ground conductor pattern of the inner layer of the substrate is reduced or minimized. In addition, when a comparison is made under the assumption that the capacitance generated between the signal electrode pad and the ground conductor pattern in the inner portion is the same or substantially the same, because the entire signal electrode pad contributes to the joining, the joining strength of the electrode pad is able to be ensured. In this way, the impedance mismatch is reduced or prevented while the joining strength is ensured. Also, the joining strength of the ground electrode pad to the insulating base material is able to be significantly maintained. Also, even when a stress is applied to the connecting portion between the substrates, the signal electrode pad is effectively protected against such stress, which tends to cause peeling at a longitudinal end where bending stress is likely to be applied.

The substrate may be a flexible substrate.
The substrate may include a bent portion.
A connector that is electrically connected to the signal conductor pattern and the ground conductor pattern may be provided.
The substrate may be a multilayer substrate.
Preferably, the signal electrode pad includes a plurality of signal electrode pads, and all of the signal electrode pads are exposed from the first opening. With this structure, the impedance mismatch is able to be reduced or prevented for all of the transmission lines while the joining strength of all the electrode pads is ensured.

Preferably, an interlayer connection conductor that connects the signal electrode pad and the signal conductor pattern is provided, and the interlayer connection conductor and the signal electrode pad are circular or substantially circular in plan view of the substrate. With this structure, the capacitance generated between the signal electrode pad and the surrounding conductor pattern is reduced or minimized, and the impedance mismatch is reduced or prevented.

Preferably, the interlayer connection conductor is provided immediately below the signal electrode pad. According to this structure, a rigidity of a joining portion between the substrates is increased. Further, the joining strength of the signal electrode pad to the insulating base material is increased.

Preferably, interlayer connection conductors that connect the ground electrode pads and the ground conductor pattern are provided, and the interlayer connection conductors that connect the ground electrode pads and the ground conductor pattern are circular or substantially circular in plan view of the substrate. With this structure, the capacitance generated between the ground electrode pad and the signal electrode pad close thereto is further reduced, and the impedance mismatch is reduced or prevented.

A transmission line device according to a preferred embodiment of the present invention includes a plurality of substrates each including a transmission line including an insulating base material and a conductor pattern provided on the insulating base material, the transmission line of one of two adjacent substrates of the plurality of substrates being connected to the transmission line of another of the two adjacent substrates.

The conductor pattern includes a signal conductor pattern, a signal electrode pad electrically connected to the signal conductor pattern, a ground conductor pattern, and a ground electrode pads electrically connected to the ground conductor pattern or being a portion of the ground conductor pattern.

A resist film is provided on a surface of the insulating base material, and the resist film includes a first opening that is spaced away from an outer edge of the signal electrode pad in a surface direction of the insulating base material and exposes the signal electrode pad, and second openings that define outer edges of the ground electrode pads and expose the ground conductor pattern.

Further, the substrate has an elongated shape having a length direction and a width direction, the signal electrode pad is provided at a position sandwiched between the ground electrode pads in the length direction, and the signal electrode pad of one of the two adjacent substrates is joined to the signal electrode pad of another of the two adjacent substrates, and the ground electrode pads of one of the two adjacent substrates are joined to the ground electrode pads of another of the two adjacent substrates.

According to the above configuration, it is possible to reduce or prevent the impedance mismatch while the joining strength of the electrode pad is ensured at a portion where the substrates including the transmission lines are connected to each other. Also, the joining strength of the ground electrode pad to the insulating base material can be maintained high. Also, even when a stress is applied to the connecting portion between the substrates, the signal electrode pad is effectively protected against such stress, which tends to cause peeling at a longitudinal end where bending stress is likely to be applied.

According to preferred embodiments of the present invention, it is possible to obtain substrate joined bodies that are each able to reduce or prevent the impedance mismatch while maintaining the joining strength of the electrode pad of the substrate joined body having the transmission line, and transmission line devices each including such a substrate joined body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
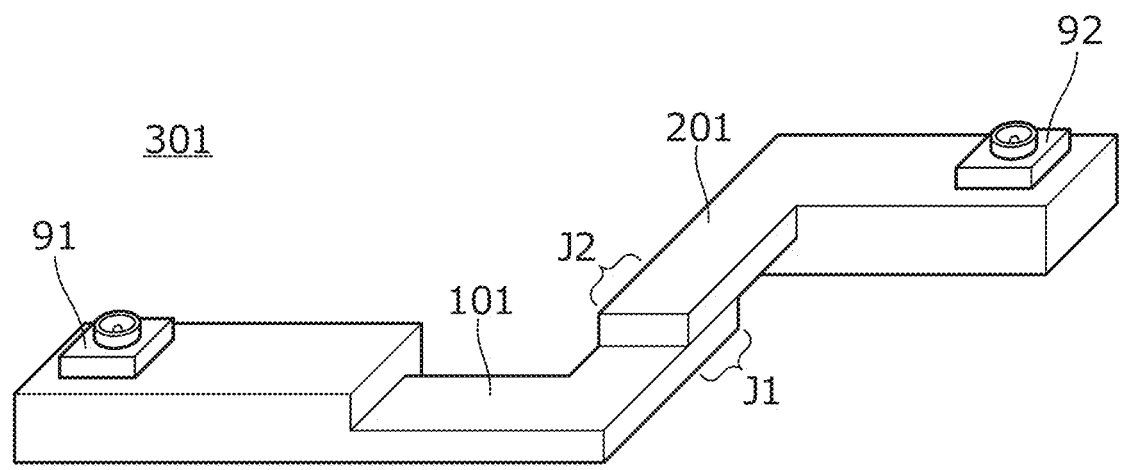
FIG. 1 is a perspective view of a transmission line device according to a first preferred embodiment of the present invention.

Hereinafter, preferred embodiments of the present invention are described with reference to the drawings and some specific examples. In the drawings, the same or similar portions and elements are denoted by the same reference numerals. Although the preferred embodiments are shown separately for convenience in consideration of the explanation of main points or the ease of understanding, partial replacement or combination of the configurations shown in different preferred embodiments is possible. In the second and subsequent preferred embodiments, description of matters common to the first preferred embodiment is omitted, and only different points are described. In particular, the same advantageous operations and effects of the same or similar configuration are not successively described for each preferred embodiment.

First Preferred Embodiment

FIG. 1 is a perspective view of a transmission line device 301 according to a first preferred embodiment of the present invention. The transmission line device 301 is provided by joining a first multilayer substrate 101 and a second multilayer substrate 201 together.

The first multilayer substrate 101 includes a joining portion J1 with the second multilayer substrate 201, and the second multilayer substrate 201 includes a joining portion J2 with the first multilayer substrate 101. That is, the joining portion J1 of the first multilayer substrate 101 and the joining portion J2 of the second multilayer substrate 201 are joined together to define the transmission line device 301. The transmission line device 301 includes coaxial connectors 91 and 92 mounted thereon. The transmission line device 301 is used, for example, as a cable having the coaxial connectors 91 and 92.

Figure 2:
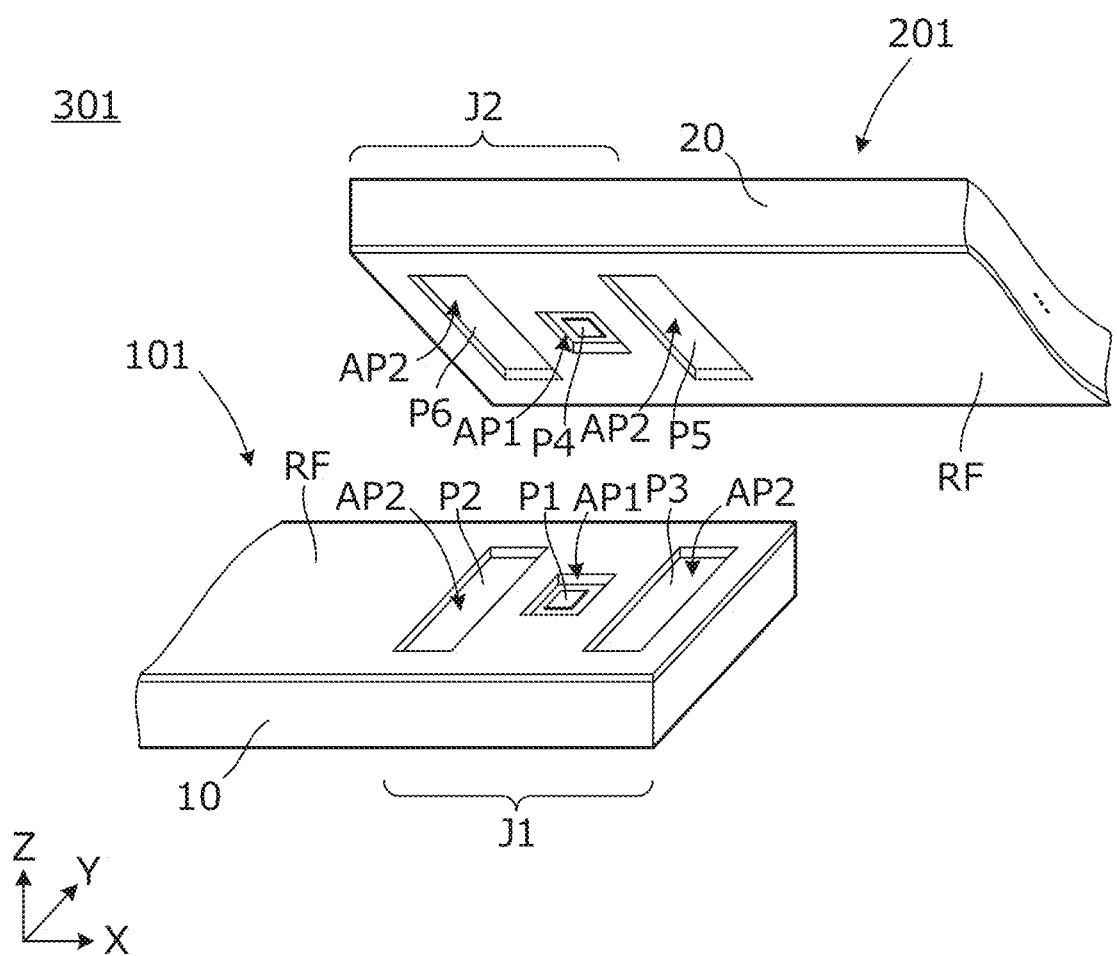
FIG. 2 is a partial perspective view showing a structure of joining portions between a first multilayer substrate and a second multilayer substrate.

FIG. 2 is a partial perspective view showing a structure of joining portions between a first multilayer substrate 101 and a second multilayer substrate 201. FIG. 2 shows a state before the first multilayer substrate 101 and the second multilayer substrate 201 are joined together.

The first multilayer substrate 101 includes a plurality of first insulating base materials that are laminated together and a first conductor pattern provided on the first insulating base materials. The first conductor pattern includes a first signal conductor pattern, a first ground conductor pattern, a first electrode pad P1 electrically connected to the first signal conductor pattern, a second electrode pad P2 and a third electrode pad P3 which are portions of the first ground conductor pattern.

In addition, the second multilayer substrate 201 includes a plurality of second insulating base materials that are laminated together and a second conductor pattern provided on the second insulating base materials. The second conductor pattern includes a second signal conductor pattern, a second ground conductor pattern, a fourth electrode pad P4 electrically connected to the second signal conductor pattern, and a fifth electrode pad P5 and a sixth electrode pad P6 which are portions of the second ground conductor pattern.

The first electrode pad P1 and the fourth electrode pad P4 correspond to a "signal electrode pad".

The first multilayer substrate 101 includes a first laminated insulator 10 provided by laminating the plurality of first insulating base materials, and a resist film RF provided on a surface (upper surface in an orientation shown in FIG. 2) of the first laminated insulator 10. The second multilayer substrate 201 includes a second laminated insulator 20 provided by laminating the plurality of second insulating base materials, and a resist film RF provided on a surface (lower surface in the orientation shown in FIG. 2) of the second laminated insulator 20.

Both the first insulating base material and the second insulating base material are flexible base materials such as, for example, liquid crystal polymer (LCP) and polyether ether ketone (PEEK), and are made of the same material. The resist film RF is, for example, a printable insulating resin material. Both the first conductor pattern and the second conductor pattern are obtained by patterning a copper (Cu) foil, for example. The resist film RF is not limited to a film provided by printing the insulating resin material, but may be, for example, a cover film made of an insulating resin film or the like to be pasted. The patterning of the cover film may be performed before or after the pasting.

The first electrode pad P1, the second electrode pad P2, and the third electrode pad P3 are provided on the same plane, and the first electrode pad P1 is between the second electrode pad P2 and the third electrode pad P3. The fourth electrode pad P4, the fifth electrode pad P5, and the sixth electrode pad P6 are provided on the same plane, and the fourth electrode pad P4 is between the fifth electrode pad P5 and the sixth electrode pad P6.

In a state in which the first joining portion J1 of the first multilayer substrate 101 and the second joining portion J2 of the second multilayer substrate 201 are joined, the first electrode pad P1 is connected to the fourth electrode pad P4, the second electrode pad P2 is connected to the sixth electrode pad P6, and the third electrode pad P3 is connected to the fifth electrode pad P5.

As shown in FIG. 2, the entire first electrode pad P1 including its outer edge is exposed from an opening AP1. Similarly, the entire fourth electrode pad P4 including its outer edge is exposed from an opening AP1. This opening AP1 corresponds to a "first opening". In addition, each of the second electrode pad P2, the third electrode pad P3, the fifth electrode pad P5, and the sixth electrode pad P6 is a portion exposed from an opening AP2 of the resist film RF. That is, the outer edges of the second electrode pad P2, the third electrode pad P3, the fifth electrode pad P5, and the sixth electrode pad P6 are covered with the resist film RF. This opening AP2 corresponds to a "second opening".

Figure 3:
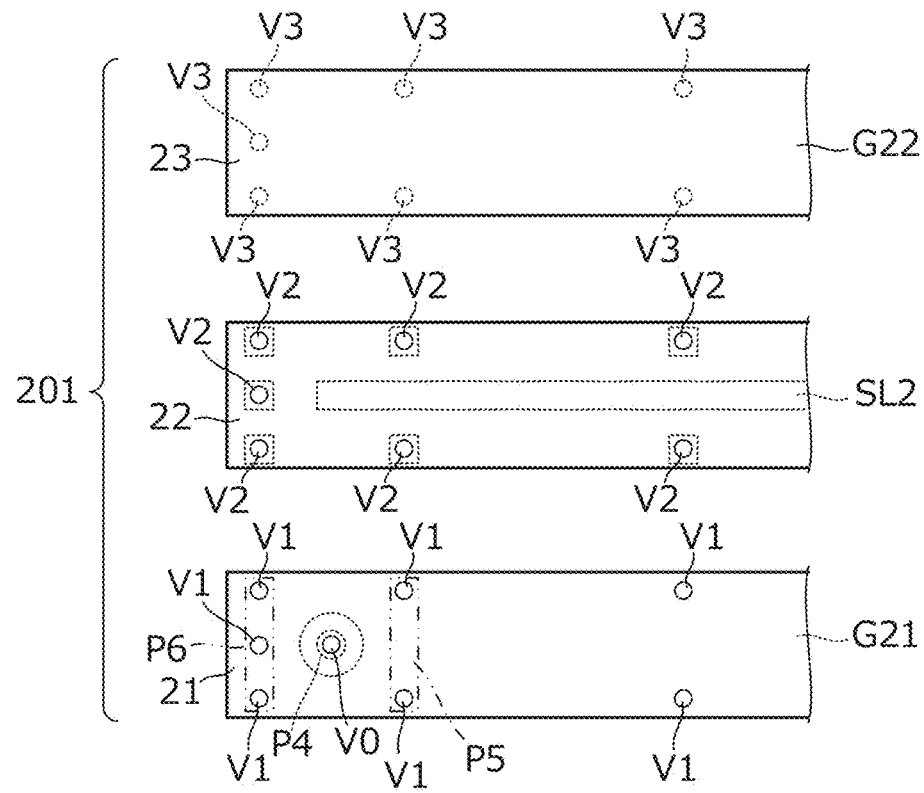
FIG. 3 is a plan view showing a shape of a first conductor pattern provided on each insulating base material of the first multilayer substrate and a shape of a second conductor pattern provided on each insulating base material of the second multilayer substrate.
Figure 3:
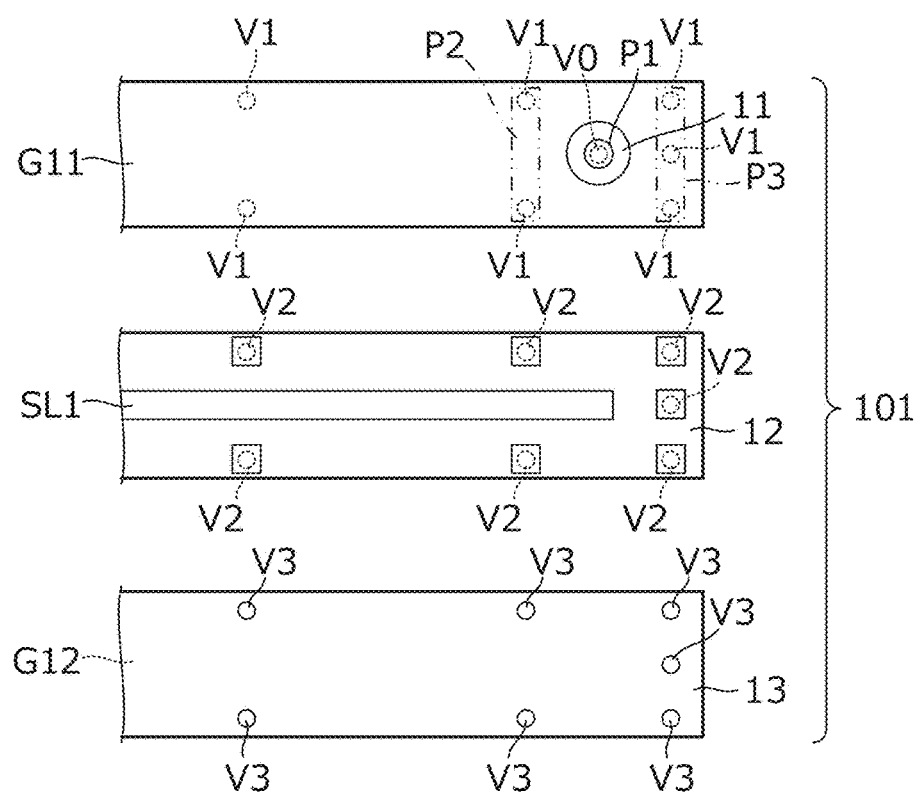
Figure 4A:
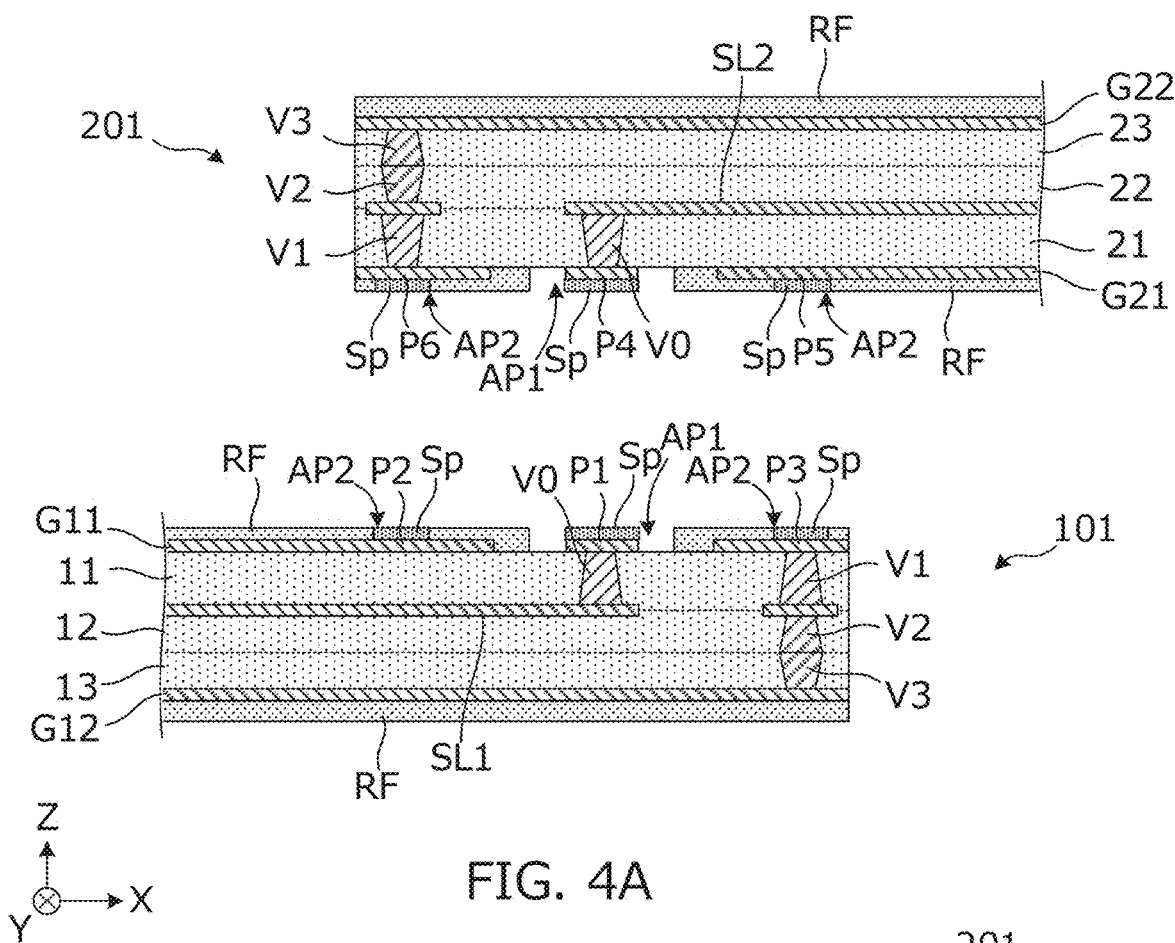
FIG. 4A is a cross-sectional view of the first multilayer substrate and the second multilayer substrate.
Figure 4B:
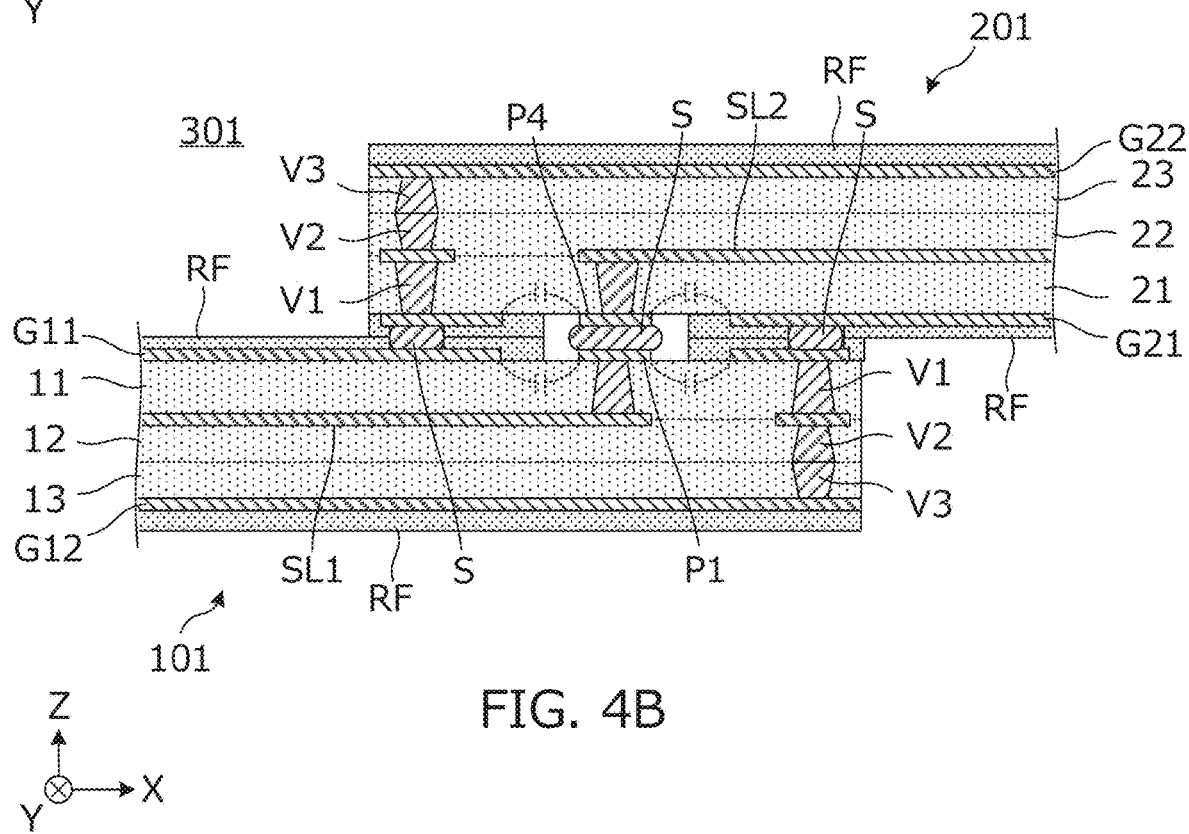
FIG. 4B is a cross-sectional view in a state in which the first multilayer substrate and the second multilayer substrate are joined together.

FIG. 3 is a plan view, along the X axis and Y axis directions shown in FIGS. 2, 4A, and 4B, showing a shape of a first conductor pattern provided on each insulating base material of the first multilayer substrate 101 and a shape of a second conductor pattern provided on each insulating base material of the second multilayer substrate 201. However, FIG. 3 shows a state before the resist film RF is provided by printing. FIG. 4A is a cross-sectional view, along the Z axis and X axis directions shown in FIGS. 2 and 4A, of the first multilayer substrate 101 and the second multilayer substrate 201, and FIG. 4B is a cross-sectional view, along the Z axis and X axis directions shown in FIGS. 2 and 4B, in a state in which the first multilayer substrate 101 and the second multilayer substrate 201 are joined together. Both of FIGS. 4A and 4B are longitudinal cross-sectional views taken along a signal conductor pattern and a plane passing through the signal conductor pattern.

The first multilayer substrate 101 includes first insulating base materials 11, 12, and 13. On an upper surface of the first insulating base material 11, the first electrode pad P1 and an upper first ground conductor pattern G11 are provided. On an upper surface of the first insulating base material 12, a first signal conductor pattern SL1 is provided. On a lower surface of the first insulating base material 13, a lower first ground conductor pattern G12 is provided.

The upper first ground conductor pattern G11 and the lower first ground conductor pattern G12 are connected by interlayer connection conductors V1, V2, and V3. Further, the first electrode pad P1 and one end of the first signal conductor pattern SL1 are connected by an interlayer connection conductor V0, as shown in FIGS. 3 and 4A. The interlayer connection conductors V0, V1, V2, and V3 are, for example, solidified organic conductive pastes.

The second multilayer substrate 201 includes second insulating base materials 21, 22, and 23. On a lower surface of the second insulating base material 21, the fourth electrode pad P4 and a lower second ground conductor pattern G21 are provided. On a lower surface of the second insulating base material 22, a second signal conductor pattern SL2 is provided. On an upper surface of the second insulating base material 23, an upper second ground conductor pattern G22 is provided.

The lower second ground conductor pattern G21 and the upper second ground conductor pattern G22 are connected by interlayer connection conductors V1, V2, V3. In addition, the fourth electrode pad P4 and one end of the second signal conductor pattern SL2 are connected by an interlayer connection conductor V0, as shown in FIGS. 3 and 4A.

In the first multilayer substrate 101 shown in FIG. 3, two portions surrounded by two-dot chain lines are openings of the resist film RF, as shown in FIGS. 4A and 4B. The upper first ground conductor pattern G11 exposed from these openings corresponds to the second electrode pad P2 and the third electrode pad P3 shown in FIG. 2. Similarly, in the second multilayer substrate 201, two portions surrounded by two-dot chain lines are openings of the resist film RF. The lower second ground conductor pattern G21 exposed from these openings corresponds to the fifth electrode pad P5 and the sixth electrode pad P6 shown in FIG. 2. Thus, the second electrode pad P2 and the third electrode pad P3 are located at positions sandwiching the first electrode pad P1 in an extending direction of the first signal conductor pattern SL1. Similarly, the fifth electrode pad P5 and the sixth electrode pad P6 are located at positions sandwiching the fourth electrode pad P4 in an extending direction of the second signal conductor pattern SL2. The opening in the resist film RF corresponding to each of the second electrode pad P2, the third electrode pad P3, the fifth electrode pad P5, and the sixth electrode pad P6 is the above-described second opening.

In the first multilayer substrate 101, two sets of the interlayer connection conductors V1, V2, and V3 that provide interlayer connection between the upper first ground conductor pattern G11 and the lower first ground conductor pattern G12 are provided immediately below the second electrode pad P2, as shown in FIGS. 3 and 4A. Similarly, three sets of the interlayer connection conductors V1, V2, and V3 are provided immediately below the third electrode pad P3, as shown in FIGS. 3 and 4A.

In the second multilayer substrate 201, two sets of the interlayer connection conductors V1, V2, and V3 that provide interlayer connection between the lower second ground conductor pattern G21 and the upper second ground conductor pattern G22 are provided immediately below the fifth electrode pad P5, as shown in FIGS. 3 and 4A (the two sets of the interlayer connection conductors V1, V2, and V3 can be said to be provided immediately above the fifth electrode pad P5 in an orientation shown in FIG. 4A). Similarly, three sets of the interlayer connection conductors V1, V2, and V3 are provided immediately below (immediately above) the sixth electrode pad P6, as shown in FIGS. 3 and 4A.

The first electrode pad P1, the second electrode pad P2, the third electrode pad P3, the fourth electrode pad P4, the fifth electrode pad P5, and the sixth electrode pad P6 are each printed (pre-coated) with, for example, a solder paste Sp, as shown in FIG. 4A.

The first joining portion J1 of the first multilayer substrate 101 and the second joining portion J2 of the second multilayer substrate 201 shown in FIG. 2 are overlapped with each other, and heated and pressed by a hot bar or the like to be soldered. Thus, as shown in FIG. 4B, the first electrode pad P1 and the fourth electrode pad P4 are connected via solder S. Similarly, the second electrode pad P2 and the sixth electrode pad P6 are connected via solder S, and the third electrode pad P3 and the fifth electrode pad P5 are connected via solder S.

One of the first electrode pad P1 and the fourth electrode pad P4 may be pre-coated with a solder paste. Similarly, one of the second electrode pad P2 and the sixth electrode pad P6 may be pre-coated with a solder paste, and one of the third electrode pad P3 and the fifth electrode pad P5 may be pre-coated with a solder paste.

The connection may be made using a conductive paste other than soldering. That is, by applying a conductive paste to one or both of the first joining portion J1 of the first multilayer substrate 101 and the second joining portion J2 of the second multilayer substrate 201, and solidifying the conductive paste by heating, the first joining portion J1 of the first multilayer substrate 101 may be joined to the second joining portion J2 of the second multilayer substrate 201.

In the present preferred embodiment, as shown in FIGS. 3 and 4A, the first signal conductor pattern SL1, the ground conductor patterns G11 and G12, and the first insulating base materials 11, 12, and 13 therebetween define a first strip line. Similarly, the second signal conductor pattern SL2, the ground conductor patterns G21 and G22, and the second insulating base materials 21, 22, and 23 therebetween define a second strip line. Then, by connecting the first multilayer substrate 101 and the second multilayer substrate 201, as shown in FIG. 4B, the transmission line device 301 is provided in which the first strip line and the second strip line are connected with each other.

The coaxial connector 91 shown in FIG. 1 is joined to the other end of the first signal conductor pattern SL1, and the coaxial connector 92 shown in FIG. 1 is joined to the other end of the second signal conductor pattern SL2. These coaxial connectors 91 and 92 are connected to connectors (receptacles) of mounting destinations.

Figure 5:
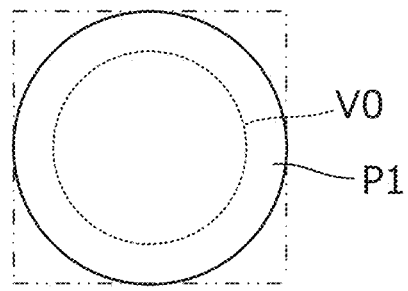
FIG. 5 is a diagram showing a shape of a signal electrode pad connected to a signal conductor pattern via an interlayer connection conductor.

FIG. 5 is a diagram showing a shape of a signal electrode pad connected to a signal conductor pattern via an interlayer connection conductor. As shown in FIGS. 4A and 5, the first electrode pad P1 connected to the signal conductor pattern SL1 via the interlayer connection conductor V0 is circular or substantially circular, for example. The fourth electrode pad P4 connected to the signal conductor pattern SL2 via the interlayer connection conductor V0, as shown in FIG. 4A, is also circular or substantially circular, for example.

Generally, a cross section of the interlayer connection conductor tends to become circular or substantially circular due to the ease of drilling the insulating base material. When forming an electrode pad that covers the entire or substantially the entire exposed surface with respect to the circular or substantially circular interlayer connection conductor, by forming the electrode pad in a circular or substantially circular shape rather than in a rectangular or substantially rectangular shape shown by a two-dot chain line in FIG. 5, an area of the electrode pad can be reduced. Accordingly, a stray capacitance generated between the first electrode pad P1 and the surrounding conductor pattern can be reduced.

With this structure, the stray capacitance generated between the signal electrode pad and the conductor pattern (ground conductor pattern G11 shown in FIG. 4A in this example) around the signal electrode pad is reduced or minimized. In FIG. 4B, the stray capacitance is represented by an element symbol of a capacitor. According to the above structure, impedance mismatch due to the stray capacitance is reduced or prevented.

Figure 6:
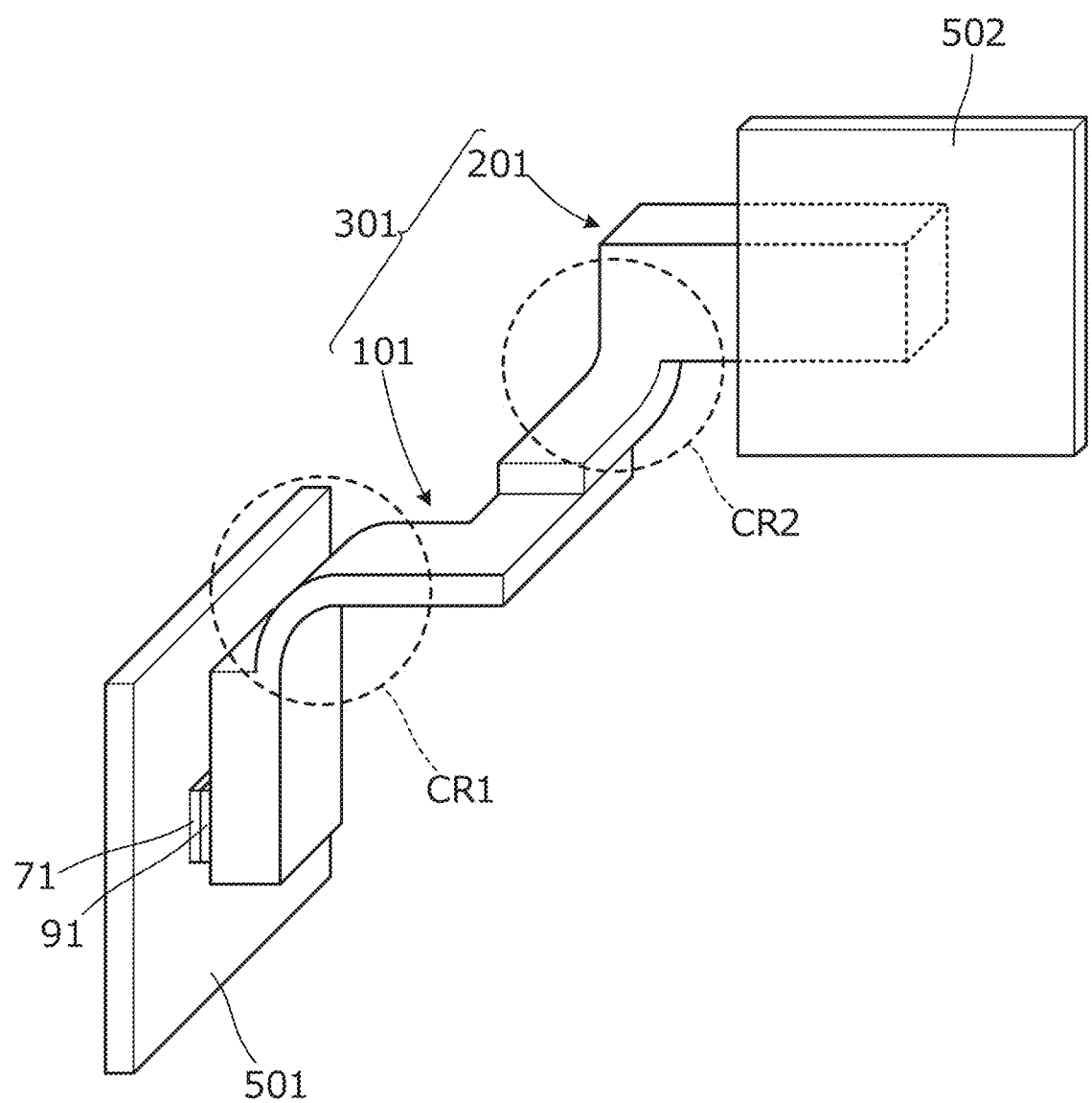
FIG. 6 is a perspective view showing a mounting structure of the transmission line device.

FIG. 6 is a perspective view showing a mounting structure of the transmission line device 301 of the present preferred embodiment. As shown in FIG. 6, the transmission line device 301 includes bent portions CR1 and CR2. The transmission line device 301 is connected between the mounting substrates 501 and 502 in a state of having their flexible portions bent. The connector 91 of the transmission line device 301 is connected to a receptacle 71 mounted on the mounting substrate 501. The connector 92 (FIG. 1) of the transmission line device 301 is connected to a receptacle mounted on the mounting substrate 502.

As described above, when the transmission line device 301 is bent and mounted, a stress is applied that tends to peel the joining portions of the first multilayer substrate 101 and the second multilayer substrate 201 from each other.

According to the present preferred embodiment, as shown in FIGS. 4B and 6, the joining portions have high peeling resistance against a stress that tends to bend the extending direction of the first signal conductor pattern SL1 and the second signal conductor pattern SL2 toward a laminating direction of the insulating base materials. In addition, the joining portions have high peeling resistance against a stress that tends to bend an orthogonal or substantially orthogonal direction (width direction) to the extending direction of the first signal conductor pattern SL1 and the second signal conductor pattern SL2 toward the laminating direction of the insulating base materials.

Further, according to the present preferred embodiment, the signal electrode pad is entirely joined to the electrode pad of the connection destination, and includes no portion (i.e., area) that does not contribute to the joining. Therefore, a capacitance generated between the signal electrode pad and the ground conductor pattern in the inner layer of the multilayer substrate is reduced or minimized. Therefore, it is possible to reduce or prevent the impedance mismatch while the joining strength of the electrode pad is ensured at a portion where the multilayer substrate having the transmission line is connected to another member. In addition, because the outer edge of the ground electrode pad is covered with the resist film, the ground electrode pad has high adhesion to the insulating base material and high resistance to peeling.

Second Preferred Embodiment

In a second preferred embodiment of the present invention, an example is described in which a configuration of the joining portion between the first multilayer substrate and the second multilayer substrate is different from that of the first preferred embodiment.

Figure 7:
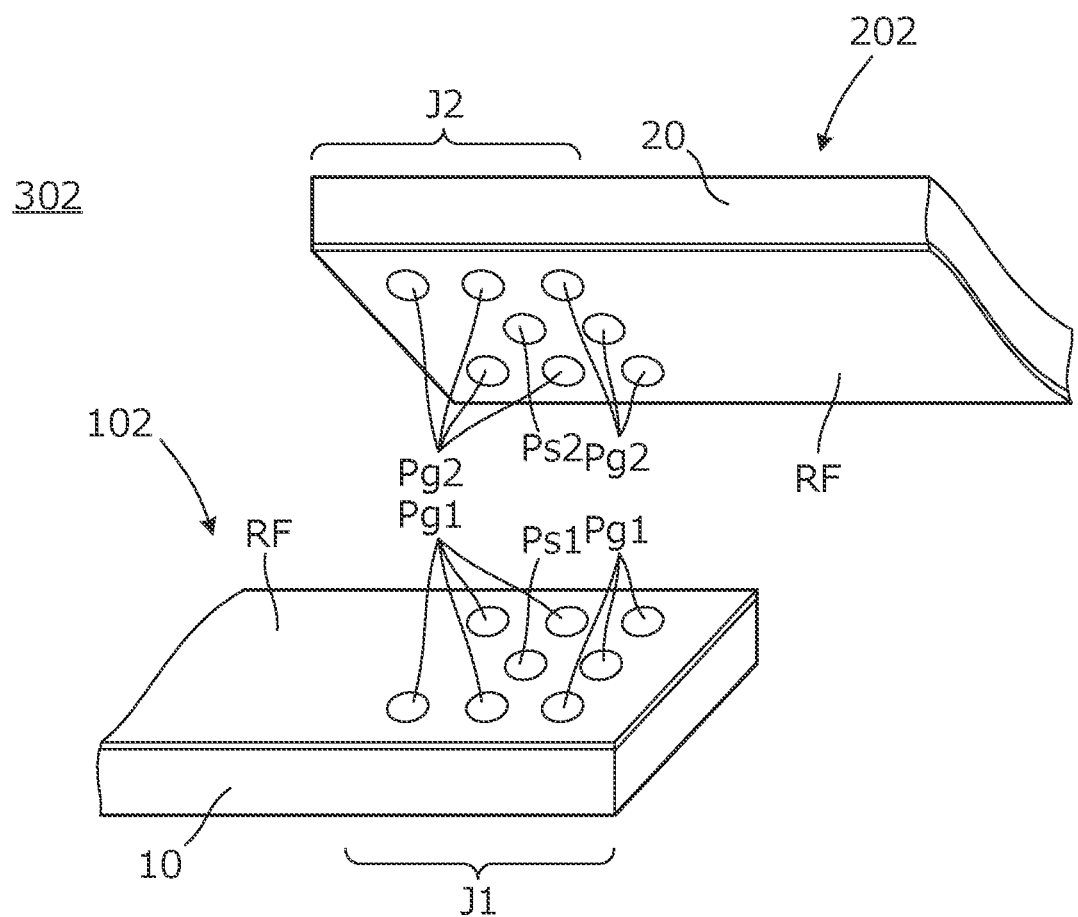
FIG. 7 is a perspective view of a transmission line device according to a second preferred embodiment of the present invention.

FIG. 7 is a perspective view of a transmission line device 302 according to a second preferred embodiment of the present invention. FIG. 7 shows a state before a first multilayer substrate 102 and a second multilayer substrate 202 are joined together. The transmission line device 302 is provided by joining the first multilayer substrate 102 and the second multilayer substrate 202.

The first multilayer substrate 102 includes a plurality of first insulating base materials that are laminated together, and a first conductor pattern provided on the first insulating base materials. The first conductor pattern includes a first signal conductor pattern, a first ground conductor pattern, a first electrode pad Ps1 electrically connected to the first signal conductor pattern, and ground electrode pads Pg1 electrically connected to the first ground conductor pattern.

In addition, the second multilayer substrate 202 includes a plurality of second insulating base materials that are laminated together, and a second conductor pattern provided on the second insulating base materials. The second conductor pattern includes a second signal conductor pattern, a second ground conductor pattern, a second electrode pad Ps2 electrically connected to the second signal conductor pattern, and ground electrode pads Pg2 electrically connected to the second ground conductor pattern.

Figure 8:
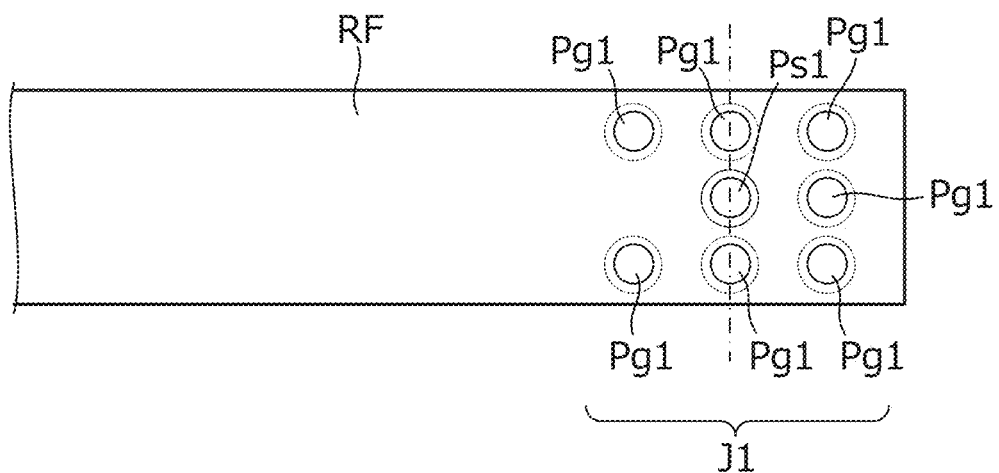
FIG. 8 is a plan view of a joining portion of a first multilayer substrate.
Figure 9A:
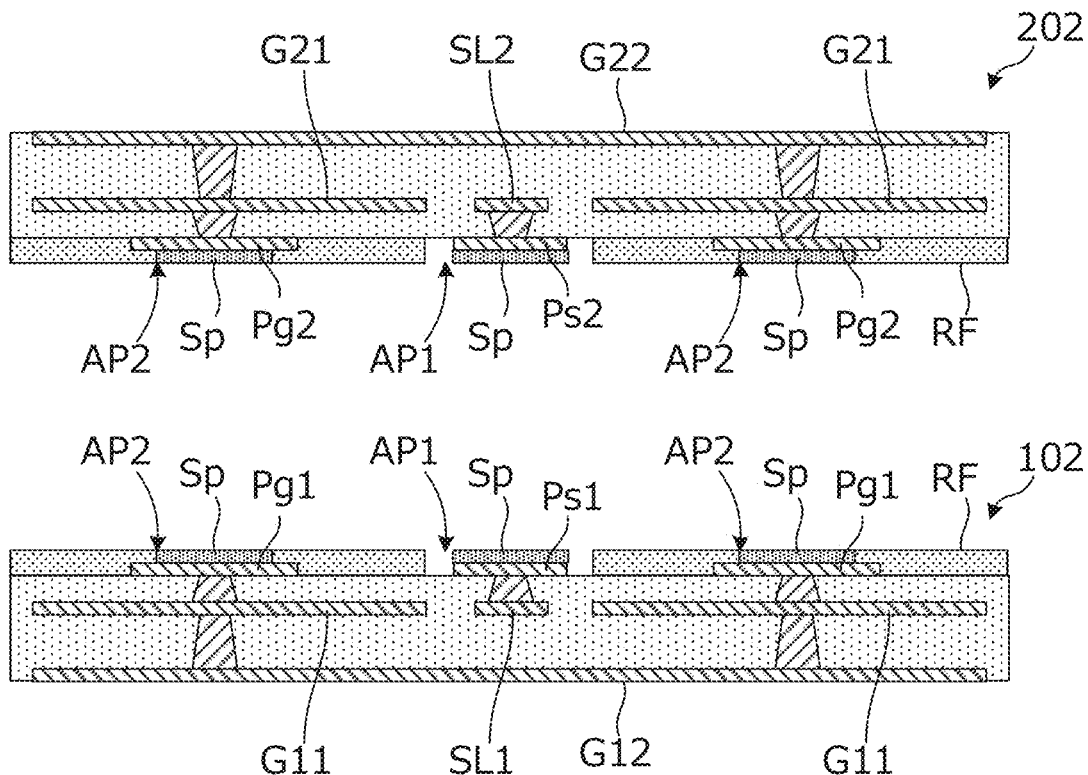
FIGS. 9A and 9B are cross-sectional views of the transmission line device.
Figure 9B:
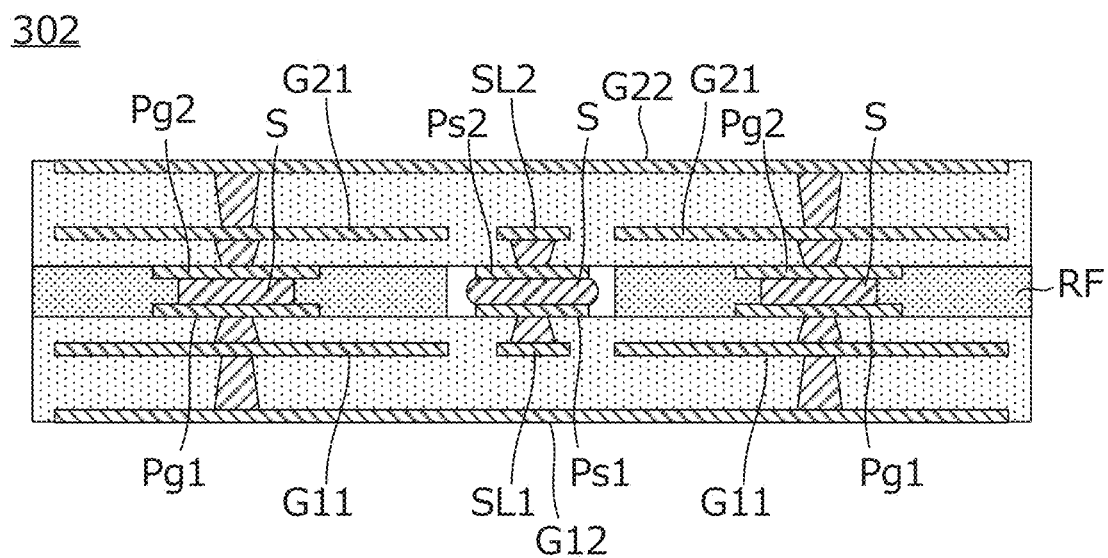

FIG. 8 is a plan view of a joining portion J1 of the first multilayer substrate 102. FIGS. 9A and 9B are cross-sectional views of the transmission line device 302. FIG. 9A is the cross-sectional view of the first multilayer substrate 102 and the second multilayer substrate 202, and FIG. 9B is the cross-sectional view in a state in which the first multilayer substrate 102 and the second multilayer substrate 202 shown in FIG. 9A are joined together. Both of FIGS. 9A and 9B are longitudinal cross-sectional views taken along a dashed-dotted line in FIG. 8.

As shown in FIG. 9A, the entire first electrode pad Ps1 including its outer edge is exposed from an opening AP1. Similarly, the entire second electrode pad Ps2 including its outer edge is exposed from an opening AP1. This opening AP1 corresponds to the "first opening".

In the present preferred embodiment shown in FIG. 9A, the plurality of ground electrode pads are provided which are connected to the ground conductor pattern via an interlayer connection conductor. A resist film RF includes openings AP2 that respectively cover the outer edges of the plurality of ground electrode pads. This opening AP2 corresponds to the "second opening".

In the present preferred embodiment shown in FIG. 9A, a first signal conductor pattern SL1, ground conductor patterns G11 and G12, and the first insulating base material therebetween define a first grounded coplanar line. Similarly, a second signal conductor pattern SL2, ground conductor patterns G21 and G22, and the second insulating base material therebetween define a second grounded coplanar line. Then, as shown in FIG. 9B, by connecting the first multilayer substrate 102 and the second multilayer substrate 202 shown in FIG. 9A together, the transmission line device is provided in which the first grounded coplanar line and the second grounded coplanar line are connected.

Figure 10A:
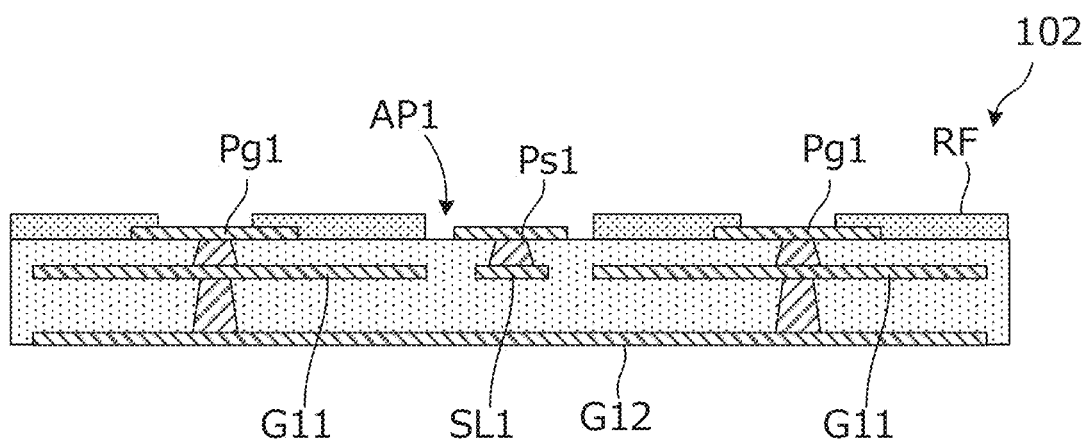
FIG. 10A is a cross-sectional view of the transmission line of the multilayer substrate of the second preferred embodiment of the present invention.
Figure 10B:
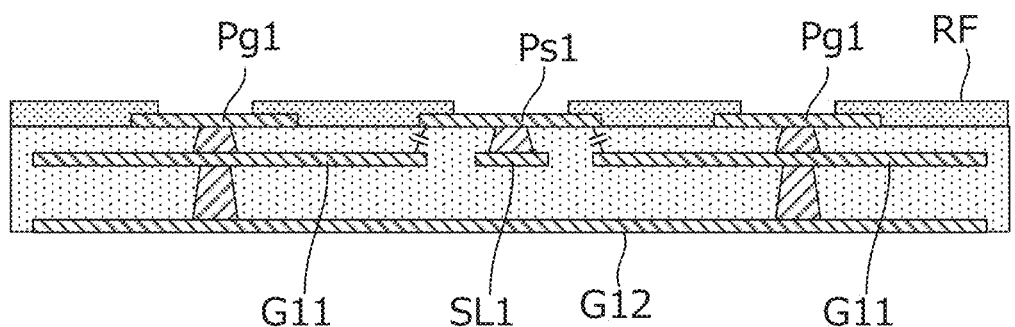
FIG. 10B is a cross-sectional view of a transmission line of a comparative example.

FIG. 10A is a cross-sectional view of the transmission line of the multilayer substrate 102 of the present preferred embodiment. FIG. 10B is a cross-sectional view of a transmission line of a comparative example. The transmission line of the comparative example shown in FIG. 10B includes a resist film RF covering an outer edge of a first electrode pad Ps1. The first electrode pad Ps1 in the transmission line of the comparative example includes the same exposed electrode area as, but is larger than the first electrode pad Ps1 in the transmission line of the present preferred embodiment, and overlaps with the ground conductor pattern G11 in plan view. On the other hand, in the multilayer substrate 102 of the present preferred embodiment, the outer edge of the first electrode pad Ps1 is exposed from the opening (first opening) AP1 of the resist film RF. Therefore, the stray capacitance generated between the first electrode pad Ps1 and the ground conductor pattern G11 is reduced or minimized.

Third Preferred Embodiment

In a third preferred embodiment of the present invention, some positional relationships between a signal electrode pad and ground electrode pads are specifically described.

Figure 11A:
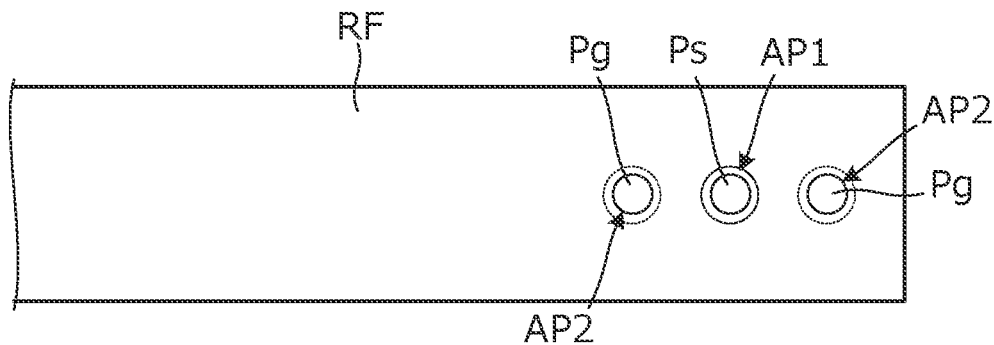
FIGS. 11A to 11C are respectively plan views of joining portions of transmission lines according to a third preferred embodiment of the present invention.
Figure 11B:
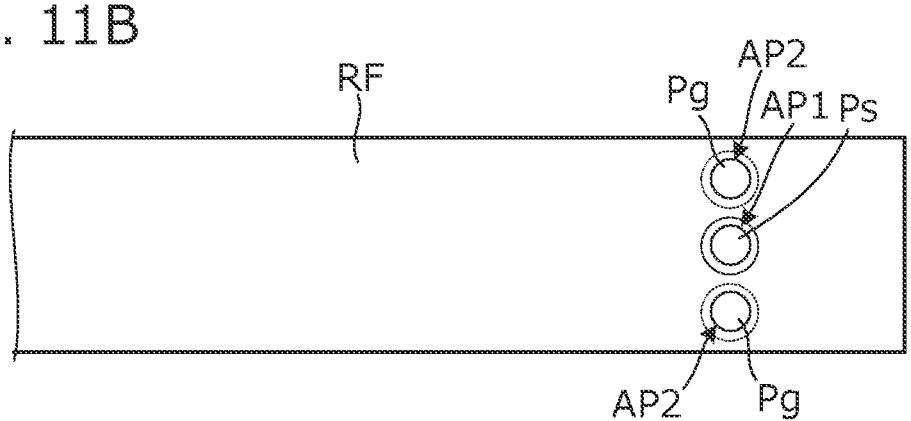
Figure 11C:
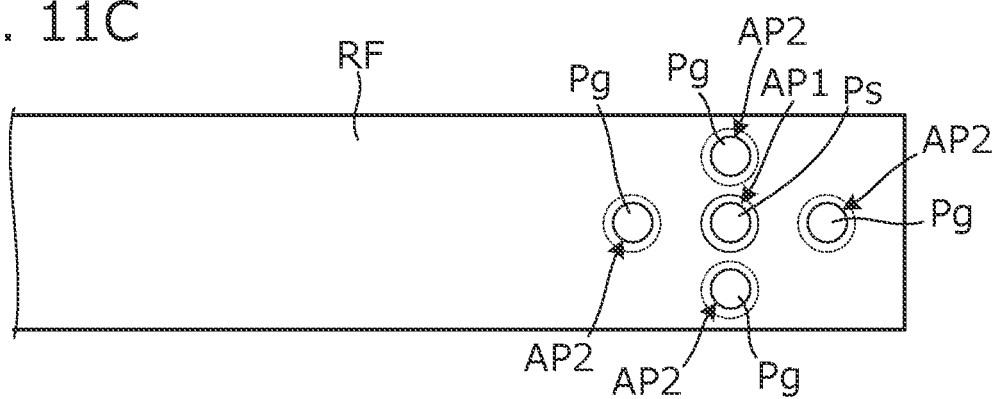

FIGS. 11A to 11C are respectively plan views of joining portions of transmission lines according to a third preferred embodiment of the present invention. Each of the transmission lines is a multilayer substrate including a signal electrode pad Ps and ground electrode pads Pg. This multilayer substrate has an elongated shape elongated in a direction along the X axis.

The entire signal electrode pad Ps including its outer edge is exposed from an opening AP1. This opening AP1 corresponds to the "first opening".

In the example shown in FIG. 11A, the signal electrode pad Ps is located at a position sandwiched between the ground electrode pads Pg in the longitudinal direction (direction along the X axis). With this structure, even when a stress is applied to a connecting portion between the multilayer substrate and a connected member to which the multilayer substrate is connected, the stress tending to make peeling begin from an end of the multilayer substrate, the signal electrode pad is effectively protected against the stress.

In the example shown in FIG. 11B, the signal electrode pad Ps is located at a position sandwiched between the ground electrode pads Pg in the width direction (direction along the Y axis). With this structure, even when a stress is applied to the connecting portion between the multilayer substrate and the connected member, the stress tending to make peeling begin from a side of the multilayer substrate, the signal electrode pad is effectively protected against the stress.

In the example shown in FIG. 11C, the signal electrode pad Ps is located at a position sandwiched between the ground electrode pads Pg in both the width direction and the longitudinal direction. With this structure, the signal electrode pad is effectively protected against both the stress tending to cause peeling from the end of the multilayer substrate and the stress tending to cause peeling from the side.

According to the present preferred embodiment, as described above, not only is the resistance to the peeling stress high, but also the ground electrode pads sandwich the signal electrode pad. Accordingly, shielding properties at the connecting portion of the transmission line is improved.

Fourth Preferred Embodiment

Figure 12A:
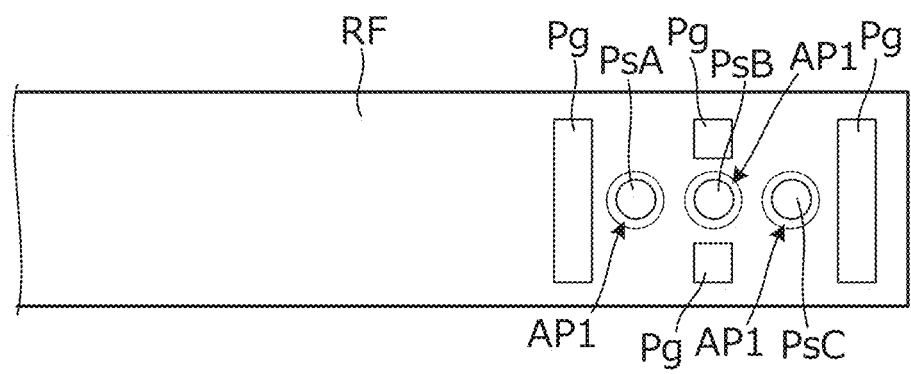
FIGS. 12A and 12B are plan views of joining portions of transmission lines according to a fourth preferred embodiment of the present invention.
Figure 12B:
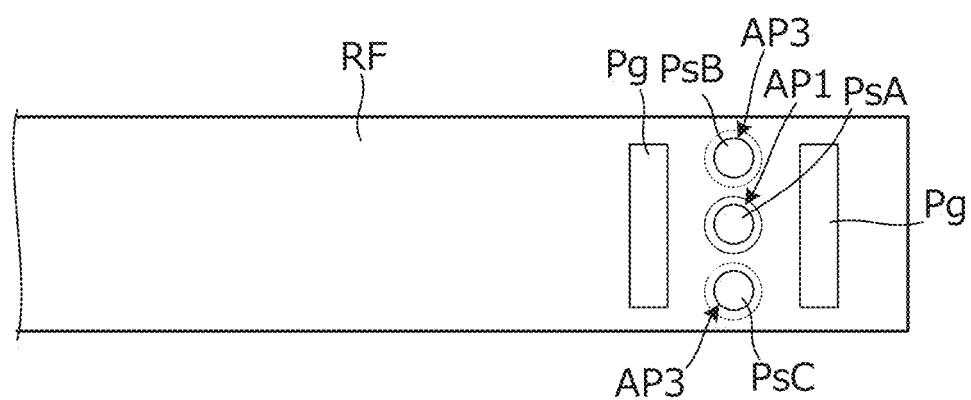

FIGS. 12A and 12B are plan views of joining portions of transmission lines according to a fourth preferred embodiment of the present invention, respectively. These transmission lines are multilayer substrates including three signal electrode pads PsA, PsB, and PsC, and a plurality of ground electrode pads Pg.

In the example shown in FIG. 12A, the signal electrode pads PsA, PsB, and PsC are respectively exposed from first openings AP1. The ground electrode pads Pg are portions of a ground conductor pattern exposed from the openings of a resist film RF. The signal electrode pads PsA, PsB, and PsC are electrically connected to a signal conductor pattern provided on an inner layer of the multilayer substrate.

In this way, by having a structure in which the plurality of signal electrode pads PsA, PsB, and PsC are provided, and all of the signal electrode pads PsA, PsB, and PsC are exposed from the first openings AP1, the impedance mismatch can be reduced or prevented for all of the transmission lines while the joining strength of all of the electrode pads is ensured.

In the example shown in FIG. 12B, the signal electrode pad PsA is exposed from the first opening AP1. The signal electrode pads PsB and PsC are exposed from openings AP3 (third openings) of the resist film RF, but the outer edges of the signal electrode pads PsB and PsC are covered with the resist film RF.

The signal electrode pad PsA shown in FIG. 12B is electrically connected to a high-frequency signal conductor pattern provided on the inner layer of the multilayer substrate. On the other hand, the signal electrode pads PsB and PsC are electrically connected to a digital signal conductor pattern provided on the inner layer of the multilayer substrate.

In the transmission line for digital signals, reflection loss due to discontinuity in characteristic impedance often does not cause a problem. As shown in this example, such a transmission line may have a structure in which the resist film covers the outer edge of the electrode pad to which the signal conductor pattern is connected. Thus, the joining strength of the signal electrode pad to the insulating base material can be maintained high.

The description of the above preferred embodiments is illustrative in all aspects and is not restrictive. Modifications and changes may be made by those skilled in the art as appropriate. The scope of the present invention is defined by the scope of the claims, rather than the preferred embodiments described above. Further, the scope of the present invention includes modifications of the preferred embodiments within the scope equivalent to the scope of the claims.

For example, in each of the preferred embodiments described above, an example is shown in which two multilayer substrates having the same or substantially the same configuration are joined. However, the "connected member" to which the transmission line of the multilayer substrate is connected is not limited to the multilayer substrate, and the same is applied to a case of a connector or integrated circuit (IC) including many pins, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate joined body comprising:
a plurality of substrates each including a respective insulating base material and a corresponding conductor pattern provided on the respective insulating base material, and portions of two adjacent substrates of the plurality of substrates being connected to each other; wherein
the conductor patterns each include a respective signal conductor pattern, a respective signal electrode pad electrically connected to the respective signal conductor pattern, a respective ground conductor pattern, and corresponding ground electrode pads electrically connected to the respective ground conductor pattern or being a portion of the respective ground conductor pattern;
the insulating base materials each include a resist film provided on a surface of the respective insulating base material;
the resist films each include a respective first opening that is spaced away from an outer edge of the respective signal electrode pad in a surface direction in which the surface of the respective insulating base material extends and exposes the respective signal electrode pad, and respective second openings that define outer edges of the corresponding ground electrode pads and expose the respective ground conductor pattern;
the plurality of substrates have an elongated shape including a length direction and a width direction;

the respective signal electrode pad is sandwiched between the corresponding ground electrode pads in the length direction; and the respective signal electrode pad of one of the two adjacent substrates is joined to the respective signal electrode pad of another of the two adjacent substrates, and the corresponding ground electrode pads of one of the two adjacent substrates are joined to the corresponding ground electrode pads of another of the two adjacent substrates.

2. The substrate joined body according to claim 1, wherein at least one of the plurality of substrates is a flexible substrate.

3. The substrate joined body according to claim 2, wherein at least one of the plurality of substrates includes a bent portion.

4. The substrate joined body according to claim 1, wherein, the plurality of substrates each further include a respective connector electrically connected to the respective signal conductor pattern and the respective ground conductor pattern.

5. The substrate joined body according to claim 1, wherein at least one of the plurality of substrates is a multilayer substrate.

6. The substrate joined body according to claim 1, wherein each respective signal electrode pad includes a corresponding plurality of signal electrode pads, and all of the corresponding plurality of signal electrode pads are exposed from the respective first opening.

7. The substrate joined body according to claim 1, wherein
the plurality of substrates each further include a respective interlayer connection conductor that connects the respective signal electrode pad and the respective signal conductor pattern; and
each respective interlayer connection conductor and the respective signal electrode pad are circular or substantially circular in plan view of a corresponding one of the plurality of substrates.

8. The substrate joined body according to claim 7, wherein each respective interlayer connection conductor is disposed immediately below the respective signal electrode pad.

9. The substrate joined body according to claim 1, wherein
the plurality of substrates each further include respective interlayer connection conductors that connect the corresponding ground electrode pads and the respective ground conductor pattern; and
the respective interlayer connection conductors of each of the plurality of substrates that connect the corresponding ground electrode pads and the respective ground conductor pattern are circular or substantially circular in plan view of a corresponding one of the plurality of substrates.

10. A transmission line device comprising:
a plurality of substrates each including a respective transmission line including a respective insulating base material and a corresponding conductor pattern provided on the respective insulating base material, and the respective transmission line of one of two adjacent substrates of the plurality of substrates being connected to the respective transmission line of another of the two adjacent substrates; wherein
the conductor patterns each include a respective signal conductor pattern, a respective signal electrode pad electrically connected to the respective signal conductor pattern, a respective ground conductor pattern, and corresponding ground electrode pads electrically connected to the respective ground conductor pattern or being a portion of the respective ground conductor pattern;

the insulating base materials each include a resist film provided on a surface of the respective insulating base material;

the resist films each include a respective first opening that is spaced away from an outer edge of the respective signal electrode pad in a surface direction in which the surface of the respective insulating base material extends and exposes the respective signal electrode pad, and respective second openings that define outer edges of the corresponding ground electrode pads and expose the respective ground conductor pattern;

the plurality of substrates have an elongated shape including a length direction and a width direction;

the respective signal electrode pad is sandwiched between the corresponding ground electrode pads in the length direction; and the respective signal electrode pad of one of the two adjacent substrates is joined to the respective signal electrode pad of another of the two adjacent substrates, and the corresponding ground electrode pads of one of the two adjacent substrates are joined to the corresponding ground electrode pads of another of the two adjacent substrates.

11. The transmission line device according to claim 10, wherein at least one of the plurality of substrates is a flexible substrate.

12. The transmission line device according to claim 11, wherein at least one of the plurality of substrates includes a bent portion.

13. The transmission line device according to claim 10, wherein, the plurality of substrates each further include a respective connector electrically connected to the respective signal conductor pattern and the respective ground conductor pattern.

14. The transmission line device according to claim 10, wherein at least one of the plurality of substrates is a multilayer substrate.

15. The transmission line device according to claim 10, wherein each respective signal electrode pad includes a corresponding plurality of signal electrode pads, and all of the corresponding plurality of signal electrode pads are exposed from the respective first opening.

16. The transmission line device according to claim 10, wherein
the plurality of substrates each further include a respective interlayer connection conductor that connects the respective signal electrode pad and the respective signal conductor pattern; and
each respective interlayer connection conductor and the respective signal electrode pad are circular or substantially circular in plan view of a corresponding one of the plurality of substrates.

17. The transmission line device according to claim 16, wherein each respective interlayer connection conductor is disposed immediately below the respective signal electrode pad.

18. The transmission line device according to claim 10, wherein
the plurality of substrates each further include respective interlayer connection conductors that connect the corresponding ground electrode pads and the respective ground conductor pattern; and the respective interlayer connection conductors of each of the plurality of substrates that connect the corresponding ground electrode pads and the respective ground conductor pattern are circular or substantially circular in plan view of a corresponding one of the plurality of substrates.

\* \* \* \* \*